US008768638B2

(12) United States Patent
Feldhaus et al.

(10) Patent No.: US 8,768,638 B2
(45) Date of Patent: Jul. 1, 2014

(54) METHOD AND DEVICE FOR PERFORMING SPECTRUM ANALYSIS OF A WANTED SIGNAL OR NOISE SIGNAL

(75) Inventors: Gregor Feldhaus, München (DE); Hagen Eckert, Mering (DE)

(73) Assignee: Rohde & Schwarz GmbH & Co. KG, München (DE)

( * ) Notice: Subject to any disclaimer, the term of this patent is extended or adjusted under 35 U.S.C. 154(b) by 1095 days.

(21) Appl. No.: 11/663,939

(22) PCT Filed: Aug. 26, 2005

(86) PCT No.: PCT/EP2005/092524
§ 371 (c)(1),
(2), (4) Date: Jun. 26, 2007

(87) PCT Pub. No.: WO2006/034763
PCT Pub. Date: Apr. 6, 2006

(65) Prior Publication Data
US 2007/0250558 A1    Oct. 25, 2007

(30) Foreign Application Priority Data
Sep. 28, 2004  (DE) .......................... 10 2004 047 042

(51) Int. Cl.
*G01R 23/16* (2006.01)
*G06F 17/14* (2006.01)
(52) U.S. Cl.
USPC ............................................ 702/76; 708/405
(58) Field of Classification Search
USPC ............. 702/59, 64, 65, 75–77, 125, 126, 57, 702/66–67, 189–190, 198–199; 324/76.19, 324/76.21–76.22; 708/200, 203, 234, 236, 708/300, 309, 313–314, 400, 403–405, 708/445; 704/203, 205, 226, 268–269
See application file for complete search history.

(56) References Cited

U.S. PATENT DOCUMENTS 3,681,530 A  *  8/1972  Manley et al. ................. 704/203
4,321,680 A  *  3/1982  Bertrand et al. ................ 702/77
(Continued)

FOREIGN PATENT DOCUMENTS

DE       21 37 172           2/1973
DE       40 11 577 A1      10/1991
(Continued)

OTHER PUBLICATIONS

English translation of International Search Report Completed Apr. 28, 2006; based on corresponding PCT/EP2005/009254; Filed Aug. 26, 2005.

(Continued)

*Primary Examiner* — Toan Le
(74) *Attorney, Agent, or Firm* — Marshall, Gerstein & Borun LLP (57) ABSTRACT

A method and device for performing spectrum analysis of a signal in a plurality of frequency bands with respective different frequency resolutions. The method includes a data acquisition step and a subsequent data evaluation step for every frequency band. The data acquisition step and the subsequent data evaluation step proceeds cyclically and continuously for every frequency band of the spectrum analysis. The corresponding device for performing spectrum analysis of a signal cyclically stores a scanning sequence of the signal for every frequency band in one circular buffer each. A discrete Fourier transformer uses the cyclically stored scanning sequences to calculate the spectral values pertaining to the respective frequency band.

11 Claims, 5 Drawing Sheets

(56) References Cited

U.S. PATENT DOCUMENTS

| | | | |
|---|---|---|---|
| 4,674,125 A * | 6/1987 | Carlson et al. | 382/303 |
| 4,896,102 A * | 1/1990 | DuBois | 324/76.28 |
| 5,038,096 A * | 8/1991 | Obie et al. | 324/76.23 |
| 5,038,097 A * | 8/1991 | Imanaka | 324/76.24 |
| 5,233,354 A * | 8/1993 | Roth et al. | 342/160 |
| 5,289,391 A * | 2/1994 | Ibrahim et al. | 702/74 |
| 5,300,878 A * | 4/1994 | Wardle et al. | 324/76.27 |
| 5,748,507 A | 5/1998 | Abatzoglou et al. | |
| 6,208,946 B1 * | 3/2001 | Arakawa et al. | 702/77 |
| 6,574,573 B1 * | 6/2003 | Asano | 702/76 |
| 6,907,368 B2 * | 6/2005 | Bechtold et al. | 702/78 |
| 7,280,164 B2 * | 10/2007 | Yen | 348/732 |

FOREIGN PATENT DOCUMENTS

| | | | | |
|---|---|---|---|---|
| DE | 4011577 A1 * | 10/1991 | | G01R 23/16 |
| DE | 43 30 425 A1 | 3/1994 | | |
| DE | 4330425 A1 * | 3/1994 | | G01R 23/02 |

OTHER PUBLICATIONS

English translation of International Preliminary Report on Patentability based on corresponding PCT/EP2005/009254; Filed Aug. 26, 2005.

* cited by examiner

METHOD AND DEVICE FOR PERFORMING SPECTRUM ANALYSIS OF A WANTED SIGNAL OR NOISE SIGNAL

BACKGROUND OF THE INVENTION

1. Field of the Invention

The invention relates to a method and a device for spectral analysis of a useful signal or noise signal.

2. Related Technology

Analyzing a useful signal or noise signal with a spectrum analyzer or a noise-measurement station requires a spectral analysis over a broad frequency range. To achieve an efficient measurement of the signal or noise spectrum, the entire frequency range to be measured is subdivided into several frequency bands, each of which is measured with a different frequency resolution. For example, it may be meaningful to reduce the frequency resolution with an increasing frequency separation relative to the measured signal. As a result, lower-frequency frequency bands (frequency bands with a smaller frequency offset relative to the measured signal) are frequency measured with a higher frequency resolution than higher-frequency bands (frequency bands with a large frequency offset relative to the measured signal).

Modern spectrum analyzers typically operate according to the principle of superposition. With high frequency resolutions, the intermediate-frequency signal is sampled and subjected to a Fast Fourier Analysis (FFT). For low frequency resolutions, analog filters are used in the IF intermediate path and the analyzer is operated in a sweep mode.

Figure 1A:
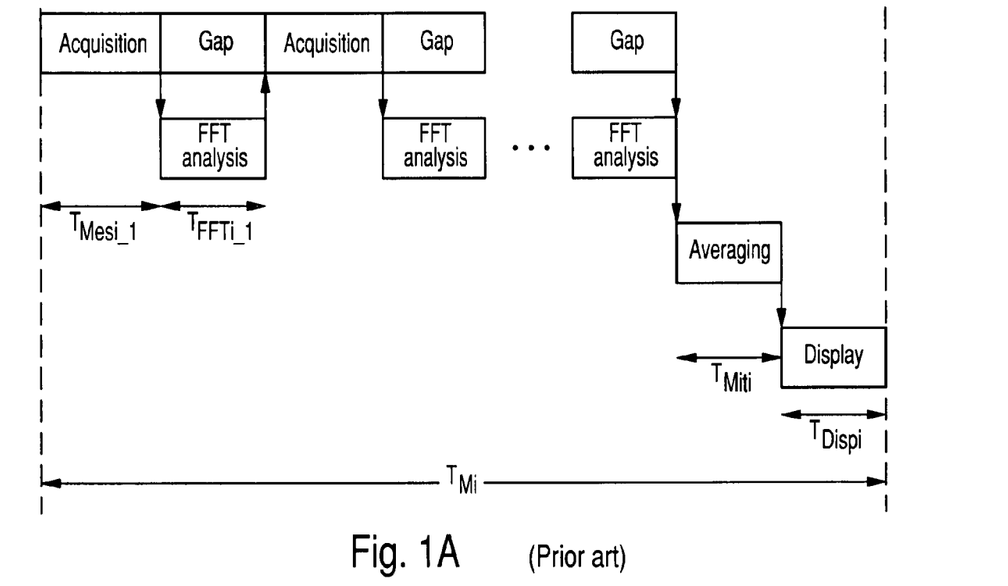
FIGS. 1A, 1B, show a time-flow diagram of a first and second embodiment of the method and the device according to the prior art for spectral analysis of a signal.

With a spectrum analyzer operating according to the discrete Fast Fourier Analysis (FFT analysis), the total measuring time $T_{MGes}$ is obtained from the sum of measuring times $T_{Mi}$ of the individual frequency bands. According to FIG. 1A, the measuring time $T_{Mi}$ in each frequency band is once again composed of a multiple corresponding to the number of averagings of the additive combination of data-acquisition time $T_{Mesi\_j}$ and data-evaluation time $T_{FFTi\_j}$ for the Fourier analysis with the addition of an averaging time $T_{Miti}$ and display time $T_{Dispi}$. The data-acquisition time $T_{Mesi\_j}$ in each frequency band is once again proportional to the frequency resolution of the respective frequency band. The total measuring time $T_{MGes}$ is therefore derived according to equation (1a).

$$T_{MGes} = \sum_{i=1}^{M} T_{Mi} = \sum_{i=1}^{M} \left( \sum_{i=1}^{m} (T_{Mesi\_j} + T_{FFTi\_j}) + T_{Miti} + T_{Dispi} \right) \quad (1a)$$

Figure 1B:
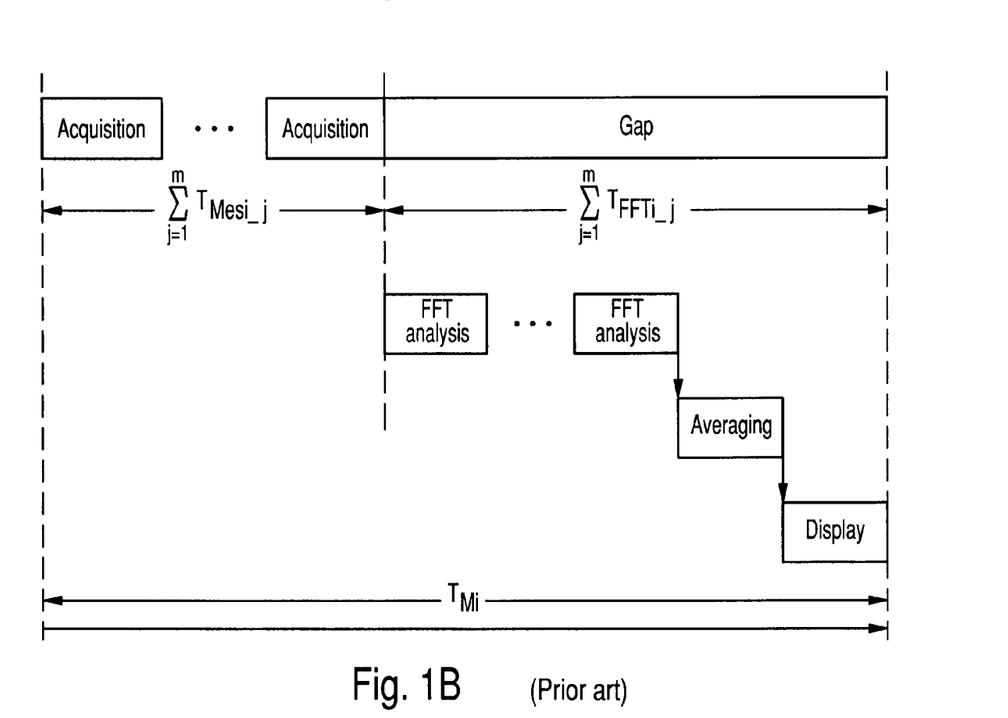

A reduction of the total measuring time $T_{MGes}$ can also be achieved according to FIG. 1B with a compact data-acquisition to be implemented repeatedly corresponding to the number of averagings and a subsequent compact data-evaluation by means of Fourier analysis to be implemented repeatedly corresponding to the number of averagings. The total measuring time $T_{MGes}$ is once again obtained according to equation (1a). Only a parallelization of the data-acquisition and data-evaluation by means of Fourier analysis leads to a reduction of the total measuring time $T_{MGes}$ according to equation (1b)

$$T_{MGes} = \sum_{i=1}^{M} T_{Mi} = \sum_{i=1}^{M} \left( \sum_{i=1}^{m} (T_{Mesi\_j}) + T_{FFTi} + T_{Miti} + T_{Dispi} \right) \quad (1b)$$

Overall, a spectrum analyzer of this kind, which operates according to the discrete Fourier analysis in several frequency bands with different frequency resolutions, and which represents the prior art, provides an excessively long total measuring time by comparison. In particular, this excessively long measuring time is attributable to the intensive sequential data-acquisition for the individual frequency bands over several averagings. This sequential data-acquisition for the individual frequency bands leads to an intermittent time recording of the signal for the individual frequency bands, which disadvantageously necessitates a longer measuring time.

GENERAL DESCRIPTION OF THE INVENTION

The invention therefore provides a method and a device for digital spectral analysis, especially digital Fourier analysis, of a signal in several frequency bands, wherein the frequency resolution can be different in the different frequency bands. The method and the device for digital spectral analysis, especially Fourier analysis, should, on the one hand, allow data-acquisition without interruption for every frequency band and, on the other hand, should considerably reduce the total measuring time for the digital spectral analysis.

The invention provides a method for spectral analysis of a signal in several frequency bands with different frequency resolution in each case, which comprises at least one data-acquisition step and a subsequent data-evaluation step for each frequency band, wherein the data-acquisition step and the subsequent data-evaluation step proceed cyclically without interruption for each frequency band of the spectral analysis, and that the data-acquisition step includes a step or sampling the signal at a sampling frequency matching the respective frequency band; and a step or storing of the respectively-sampled values of the signal in a ring memory associated with the respective frequency band.

The invention also provides a device for spectral analysis of a signal in several frequency bands each with a different frequency resolution with several sampling units, which generate sampling sequences associated with the respective frequency band with a sampling frequency matching the frequency band; with associated ring memories, wherein the ring memories are arranged to store a sampling sequence of the signal for each frequency band in a cyclical manner without interruption; and with associated discrete Fourier transformers, each of which calculates the spectral values associated with the respective frequency band without interruption.

In the case of the method according to the invention and the device according to the invention for spectral analysis of a signal, a sampling sequence is generated from the signal to be analyzed cyclically and without interruption within the framework of the data-acquisition for each frequency band with a sampling frequency required for the respective frequency band. This sampling sequence, which is specific for each frequency band, is generated via several sampling units—analog-digital converters or decimation units—and stored cyclically in a ring memory associated with the respective frequency band. As soon as a number of sampled values necessary for a Fourier analysis in the respective frequency band has been updated and stored in the respective ring memory, these sampling values are read out without interrupting the data-acquisition from an FFT analyzer associated with the respective frequency band and used for the cyclical calculation of the updated spectral values for the respective frequency band.

In this manner, the total measuring time is determined approximately through the frequency band with the largest product of data-acquisition time and number of averagings, as shown in equation (1c), which is presented below.

As an essential advantage over the prior art, the method according to the invention and the device according to the invention provide a faster, gap-free online data-evaluation of the data acquired for all frequency bands, while the data for the next cycle are acquired in parallel in the background. In the case of the prior art, the data acquired for all frequency bands can be displayed only after the completion of the entire FFT analysis; by contrast, the method according to the invention and the device according to the invention allow a display of data even during the course of the data-acquisition, as soon as evaluations are available from the first data acquired.

In order to minimize the hardware and software costs for generating every sampling sequence specific for the respective frequency band of the signal to be analyzed, several sampling units are connected to one another in sequence or in parallel in a second embodiment of the device according to the invention. While the first sampling unit is a pure analog/digital converter, the second and any further sampling units are estimation units consisting of a filter with series-connected undersampling unit. With a skillful selection of the division factors in the individual undersampling units of the individual decimation units and with a skillful selection of the structure of the series and/or parallel connection of the individual decimation units, the cost for the decimation units required can be significantly reduced by comparison with a realization, in which an individual sampling unit—analog/digital converter or decimation unit—is provided for each frequency band.

One further advantage of the method according to the invention and the device according to the invention for spectral analysis of a signal is the use of spectral values present at the edges or overlap regions of the FFT analyses or power-density values for other frequency bands. For example, spectral lines in the overlap region of a higher-frequency frequency analysis can be used temporarily for measurement and display in a lower-frequency analysis and can be replaced by the subsequently-obtained analysis of the lower-frequency band. Advantages are also achieved, if mutually-adjacent bands operate with a different frequency resolution. For example, the overlapping region is present with a lower and a higher frequency resolution. By using spectral values with different frequency resolution, the transitional region between the frequency bands can be smoothed with a different resolution.

Finally, the spectral values calculated from the FFT analyzers of the respectively-adjacent frequency bands or power-density values at the edges of the respectively-adjacent frequency bands can be exchanged with one another and used for averaging the power-density values obtained from the spectral values at the edges of the individual frequency bands. In a similar manner, if overlapping frequency bands are present, the spectral values or power-density values in the overlap region of the FFT analyzer associated in each case with the adjacent frequency band can also be exchanged and used for averaging. In this manner, the evaluation time for the measured data can be reduced and measured data can therefore be displayed sooner.

BRIEF DESCRIPTION OF THE DRAWINGS

Two embodiments of the method according to the invention and the device according to the invention for spectral analysis of a signal are explained in greater detail below with reference to the drawings. The drawings are as follows.

DETAILED DESCRIPTION

Figure 2A:
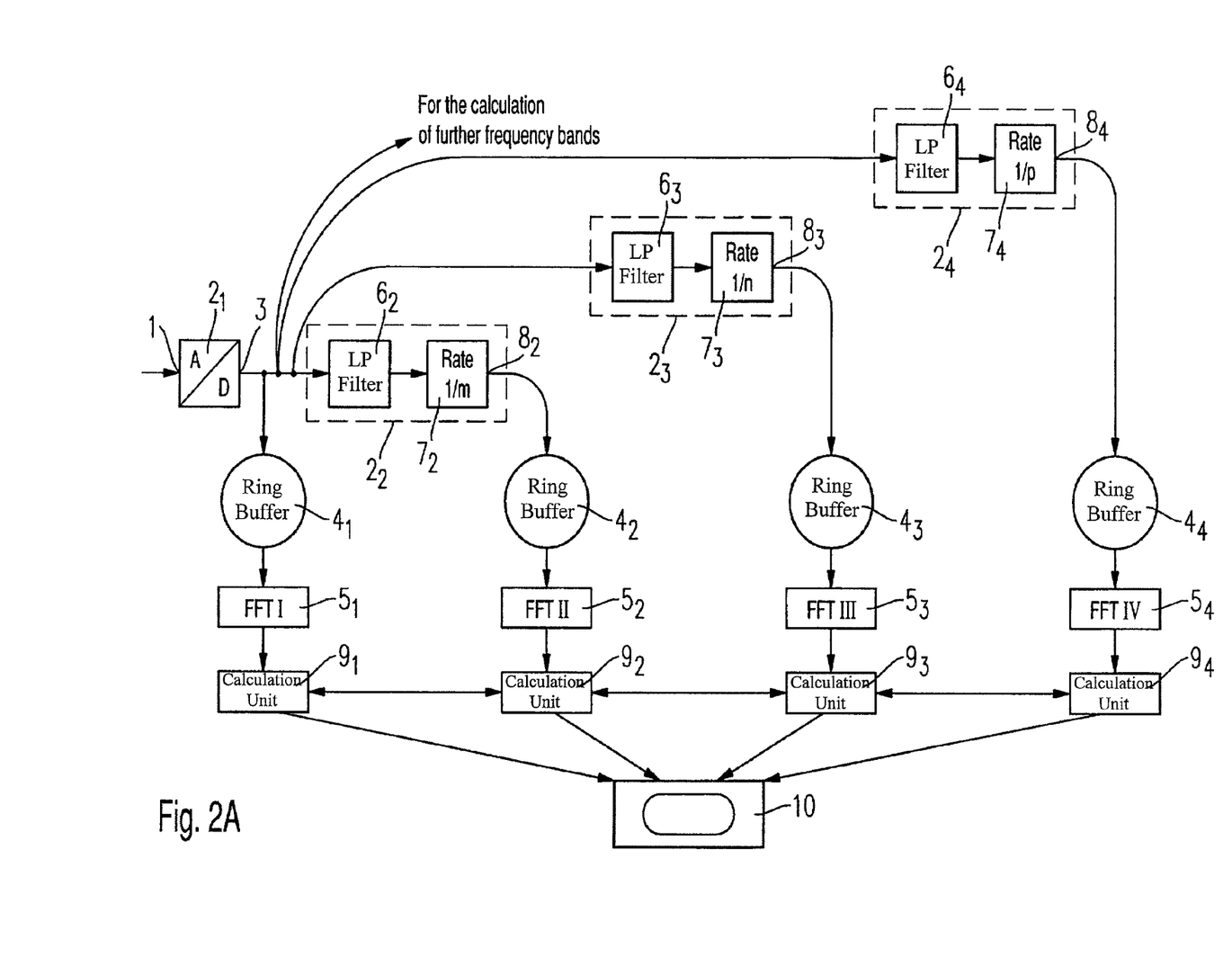
FIGS. 2A, 2B show a block circuit diagram of the first and second embodiment of the device according to the invention for spectral analysis of a signal.

The first embodiment of the device according to the invention for spectral analysis of a useful signal or noise signal is supplied with the useful signal or noise signal to be analyzed at the input 1 of the first sampling unit $2_1$, which is designed as an analog-digital converter. In the first sampling unit $2_1$, a sampling of the analog useful signal or noise signal is implemented at a given sampling frequency $f_s$. The sampling sequence of the digitized useful signal or noise signal present at the output 3 of the first sampling unit $2_1$ is supplied to a first ring memory $4_1$.

The sampling sequence of the useful signal or noise signal sampled at the sampling frequency $f_s$ is written cyclically without interruption to the first ring memory $4_1$, which provides a given memory capacity. As soon as a number of new sampled values sufficient for a subsequent Fourier analysis of the useful signal or noise signal digitized at the sampling frequency $f_s$ has been stored, a first discrete Fourier transformer $5_1$ reads out the number of sampled values required for a new discrete Fourier analysis of the useful signal or noise signal digitized at the sampling frequency $f_s$ and calculates from these the discrete spectral values of the frequency band I in the highest frequency range to be displayed.

The sampling rate required for the display of the digitized useful signal or noise signal in a given frequency band should be designed according to the Nyquist criterion to be at least double the value of the upper limit frequency of the frequency band. At the same time, a measuring time of the digitized useful signal or noise signal proportional to the frequency resolution is obtained with a given frequency resolution in the frequency band.

Accordingly, with the same FFT evaluation length and without taking averagings into consideration, a higher sampling frequency of the digitized useful signal or noise signal is obtained for a higher-frequency frequency band, and because of the lower frequency resolution, a shorter measuring time is obtained than for a lower-frequency frequency band.

According to the invention, sampling sequences of the digitized useful signal or noise signal are generated in parallel in each case at the appropriate sampling frequency for display in the remaining lower-frequency frequency bands. In each case, a second, third and fourth sampling unit $2_2$, $2_3$, and $2_4$ realized respectively as a decimation unit, each of which is connected to the output 3 of the first sampling unit $2_1$ is provided for this purpose, for example, for the three lower-frequency frequency bands II, III, and N of the device according to the invention for spectral analysis of a signal illustrated in FIG. 2A.

Each decimation unit $2_2$, $2_3$, and $2_4$ includes a series circuit of a low-pass filter $6_2$, $6_3$, and $6_4$ and an undersampling unit $7_2$, $7_3$, and $7_4$. The undersampling units $7_2$, $7_3$, and $7_4$ each provide a different frequency division factor 1/m, 1/n, and 1/p, so that a sampling sequence of the digitized useful signal or noise signal is present at the output $8_2$ of the decimation unit $2_2$ with a sampling frequency of $f_s/m$, a sampling sequence of the digitized useful signal or noise signal is present at the output $8_3$ of the decimation unit $2_3$ with a sampling frequency $f_s/n$, and a sampling sequence of the digitized useful signal or noise signal is present at the output of the decimation unit $2_4$ with a sampling frequency $f_s/p$.

These sampling sequences of the digitized useful signal or noise signal are each supplied cyclically and without interruption with a different sampling frequency to a second, third, and fourth ring memory $4_2$, $4_3$, and $4_4$. If a number of newly-stored sampled values of the digitized useful signal or noise signal sufficient for the Fourier analysis in the respective frequency band II, III, and IV is present in the second, third, and fourth ring memories $4_2$, $4_3$, and $4_4$, the respective second, third and fourth discrete Fourier transformer $5_2$, $5_3$, and $5_4$ reads out these newly-stored sampled values and calculates from these sampled values the updated spectral values $A_i(f)$ of the respective frequency band II, III and IV by means of a discrete Fourier analysis. Without restriction of generality, the frequency resolution for each partial band can be adjusted to be the same or different by selecting a corresponding FFT evaluation length. In the functional units $9_1$, $9_2$, $9_3$, and $9_4$ respectively adjacent to the discrete Fourier transformers $5_1$, $5_2$, $5_3$, and $5_4$, the respective power values $L_i(f)$ of the power spectrum are calculated from the individual spectral values $A_i(f)$ according to equation (2), and the power-density values $\overline{L}_i(f)$ of the power-density spectrum are calculated according to equation (3) by averaging over several averaging intervals.

$$L_i(f) = |A_i(f)|^2 \quad (2)$$

$$\overline{L}_i(f) = \frac{1}{n}\sum_{i=1}^{n} L_i(f) \quad (3)$$

The power-density spectrum $\overline{L}_i(f)$ for all of the, for example, four frequency bands is then visualized in a display device 10.

Figure 2B:
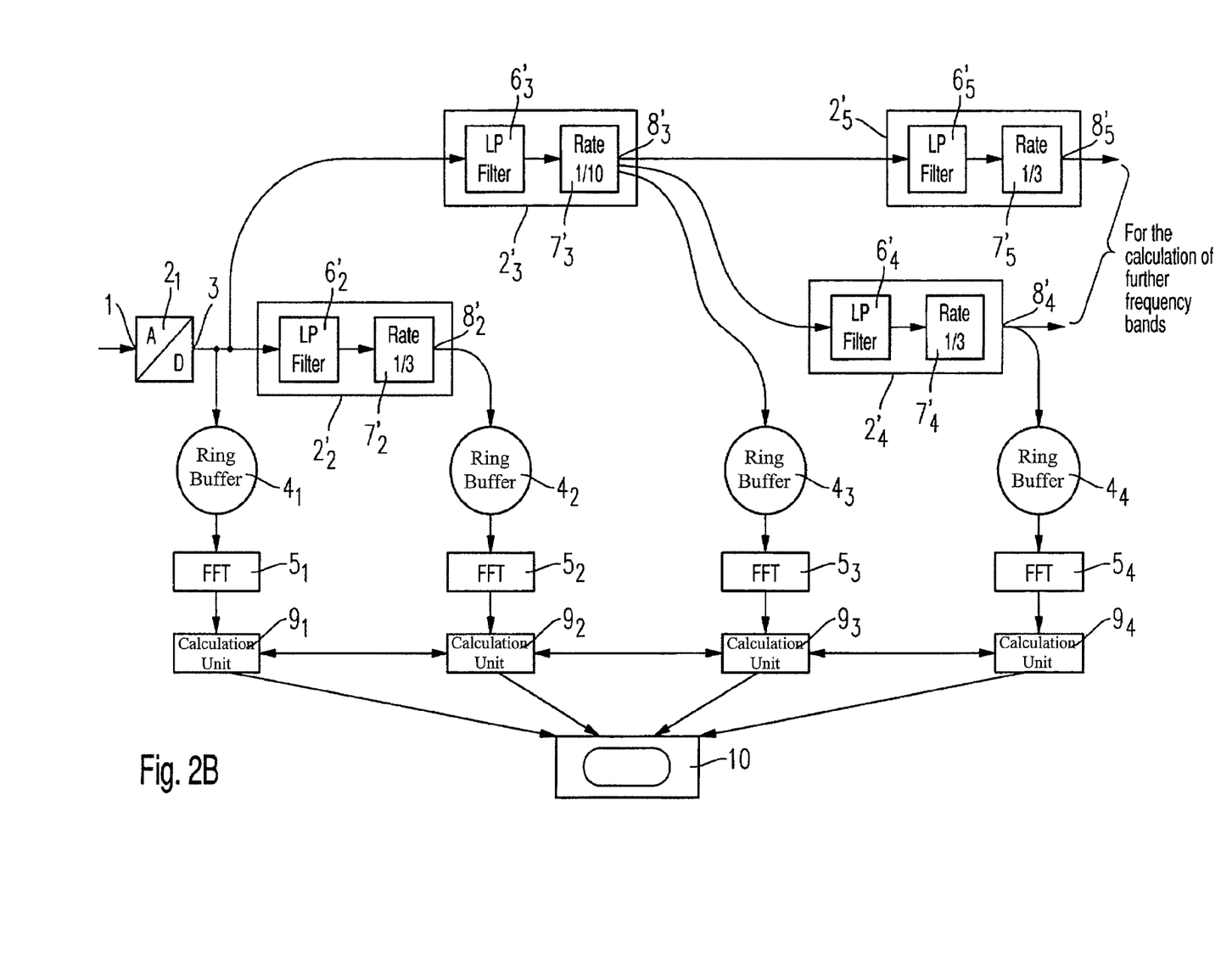

FIG. 2B shows a second embodiment of the device according to the invention for spectral analysis of a signal. The same reference numbers are used for features of the second embodiment, which are the same as features of the first embodiment, and the description of these features is not repeated.

By contrast with the first embodiment with a purely parallel connection of the decimation units $2_2$, $2_3$, $2_4$, and so on, the decimation units $2_2'$, $2_3'$, $2_4'$ and $2_5'$ with respective outputs $8_2'$, $8_3'$, $8_4'$ and $8_5'$, and so on in the second embodiment are connected not only in parallel but also in series. As a result of the serial connection of the decimation units, it is possible to generate a sampling sequence of the digitized useful signal or noise signal with a given sampling frequency and, in this context, to reduce the division factors of the individual undersampling units in the individual decimation units by comparison with the first embodiment. Smaller division factors for the undersampling units reduce the costs for hardware and software for the individual decimation units. As a result, the respectively-associated low-pass filter $6_2'$, $6_3'$, $6_4'$ and $6_5'$ and also the internal ring memories of the respective decimation units $7_2'$, $7_3'$, $7_4'$ and $7_5'$ can be designed to be significantly smaller.

In the case of the second embodiment shown in FIG. 2B with, for example, a half-decadic design of the individual frequency bands—frequency band I: 30 kHz-100 kHz, frequency band II: 10 kHz-30 kHz, frequency band III: 3 kHz-10 kHz, frequency band IV: 1 kHz-3 kHz—, the sampling frequency of the digitized useful signal or noise signal for frequency band I is generated by the first sampling unit $2_1$, for example, with a sampling frequency of 250 kHz taking into consideration the Nyquist condition. The sampling sequence of the digitized useful signal or noise signal for the frequency band II is generated with a sampling frequency of 250/3 kHz by the decimation unit $2_2'$ with a division factor of ⅓ through the associated undersampling unit $7_2'$ from the sampling sequence at the output 3 of the first sampling unit $2_1$. The sampling sequence of the digitized useful signal or noise signal for the frequency band III is generated by the decimation unit $2_3'$ with a sampling frequency of 250/10 kHz with a division factor of ¹⁄₁₀ through the associated undersampling unit $7_3'$ from the sampling sequence at the output 3 of the first sampling unit $2_1$. Finally, the sampling sequence of the digitized useful signal or noise signal for the frequency band IV is generated with a sampling frequency of 250/30 kHz by series connection of the decimation unit $2_4'$ with a division factor of ¹⁄₁₀ through the associated undersampling unit $7_4'$ and the decimation unit $2_3'$ with a division factor of ⅓ through the associated undersampling unit $7_3'$ from the sampling sequence at the output 3 of the first sampling unit $2_1$.

The sampling sequence of the digitized useful signal or noise signal at the output $8_3'$ of the decimation unit $2_3'$ with a sampling frequency of 250/10 kHz and the sampling sequence of the digitized useful signal or noise signal at the output $8_4'$ of the decimation unit $2_4'$ with a sampling frequency of 250/300 kHz can be supplied to further decimation units $2_i'$—for example decimation unit $2_5'$ in FIG. 2B. In this manner, sampling sequences can be realized with sampling frequencies, which correspond to the multiplication of the division factors of the undersampling units of the respective serial-coupled decimation units by the sampling frequency of the sampling sequence at output 3 of the first sampling unit $2_1$.

Figure 3:
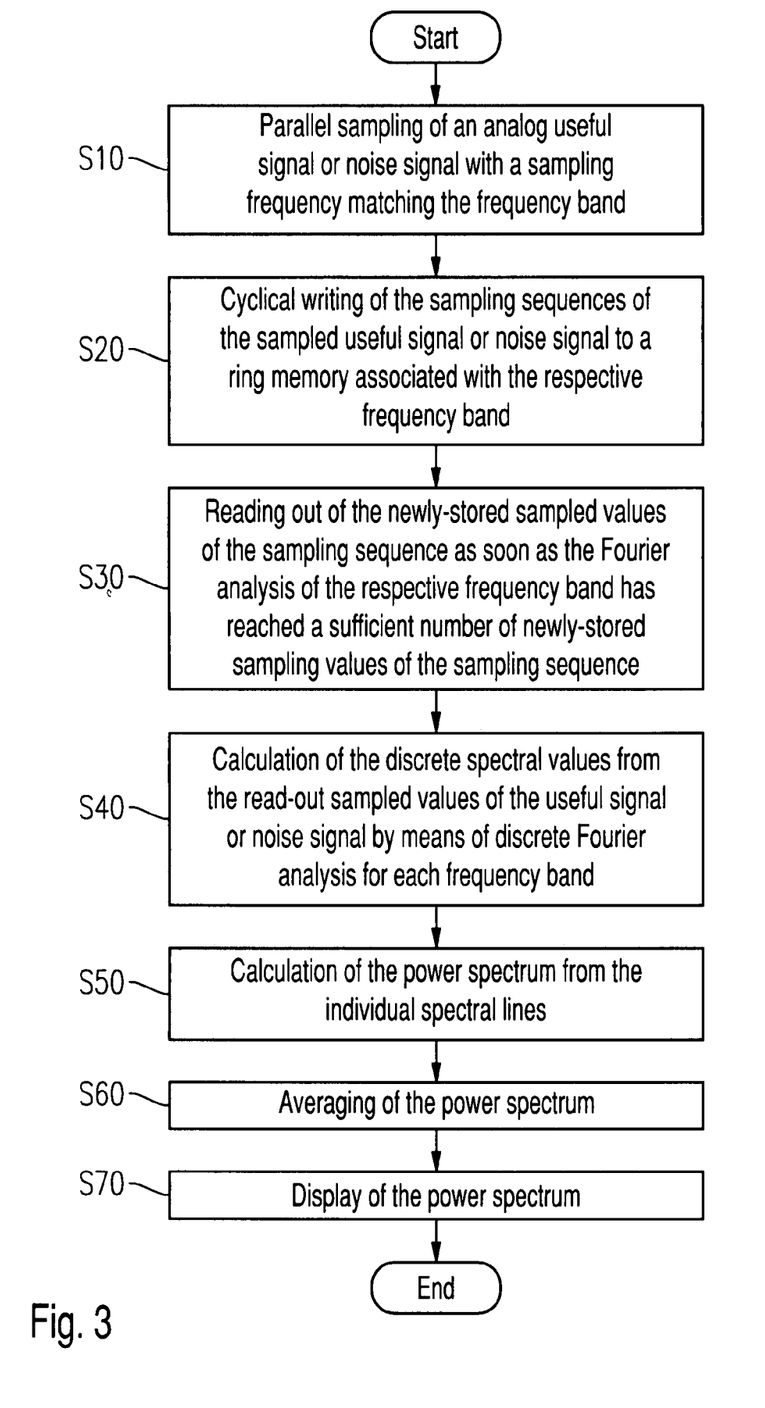
FIG. 3 shows a flow chart of the method according to the invention for spectral analysis of a signal.

FIG. 3 shows a flow chart of the method according to the invention for spectral analysis of a useful signal or noise signal.

In procedural stage S10, a sampling sequence with a sampling frequency matching the respective frequency band is generated for each frequency band from the analog useful signal or noise signal. The generation of the sampling sequence for each frequency band by means of sampling is implemented cyclically without interruption and in a quasi-parallel manner.

A delay $T_{Delay}$ occurs only at the beginning of sampling for the sampling sequences in lower-frequency frequency bands because of a possible serial connection of several sampling units.

In the next procedural stage S20, each of the sampling sequences is read cyclically and without interruption into a ring memory with a sampling frequency specific for the respective frequency band.

As soon as a number of sampling values of the respective sampling sequence sufficient for the subsequent Fourier analysis in the respective frequency band has been newly stored in the ring memory provided for each frequency band, the reading out of this number of newly-sampled values of the respective sampling sequence sufficient for the Fourier analysis is implemented in the subsequent procedural stage S30.

This reading out of the sampled values of the respective sampling sequence also takes place cyclically.

In procedural stage S40, the discrete spectral values matching the respective frequency band are calculated via a discrete Fourier analysis in each case in one discrete Fourier transformer for each frequency band from the read-out sampled values of the useful signal or noise signal sampled with the sampling frequency matching the respective frequency band.

In the next procedural stage S50, the individual power values $L_i(f)$ of the power spectrum are calculated from the spectral values of the Fourier analysis for each frequency raster point in each frequency band according to equation (2).

In procedural stage S60, a power-density value $\overline{L}_i(f)$ of the power-density spectrum is calculated according to equation (3) from power values $L_i(f)$ determined respectively in several cycles of the power spectrum for each frequency raster point of the respective frequency band. In particular, procedural stage S60 for averaging the power values $L_i(f)$ at each frequency raster point in each frequency band can also be used for averaging beyond the frequency-band limit.

The data acceptance time for measurement evaluation of already-recorded measured data is exploited by parallelization of the processing.

In the final procedural stage S70, the individual power-density values $\overline{L}_i(f)$ for each frequency band calculated by means of Fourier analysis, power calculation and averaging are displayed in a display device. The measurement evaluations for the various frequency bands are generally combined for display in a diagram. As already explained, a special treatment can be provided in the edge regions of the individual frequency bands, in order to smooth the measurement curve by exploiting the higher frequency resolution of the respectively lower frequency band. However, it is also possible to visualize only individual bands in separate measurement windows.

Other averaging methods, such as a sliding averaging according to the relationship shown in equation (4) can also be used alongside the averaging of the frequency bands and the overlapping regions as described according to the so-called Welch method (equation (3)).

$$\overline{L}_i(n, f) = a \cdot L_i(f) + (a-1) \cdot \overline{L}_i(n-1, f) \tag{4}$$

where $0 \le a \le 1$

The parallel and successive use of several similar or different averaging methods is also advantageously possible. For example, a further averaging can be applied to a series of already-averaged measured results. With the parallel application of different averaging methods and display of the averaged, measured results from both methods, inferences regarding the time variance of the measured results can be advantageously drawn.

Figure 4:
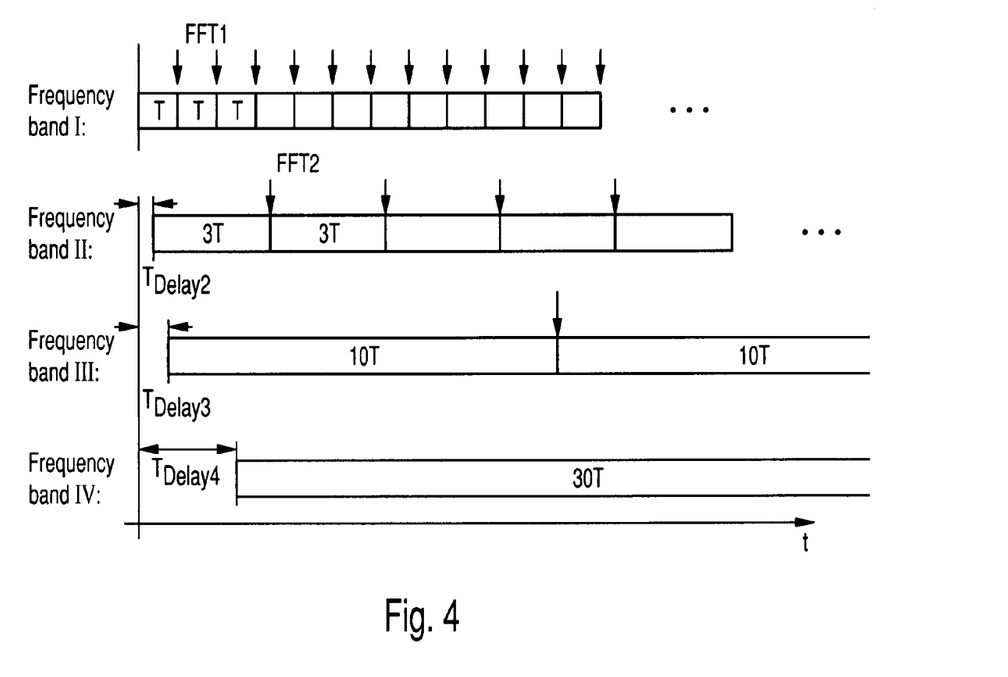
FIG. 4 shows a time-flow diagram of the method according to the invention and the device according to the invention for spectral analysis of a signal.

By way of example, FIG. 4 shows the time distribution for data-acquisition and data evaluation in each frequency band in a time-flow diagram for the four exemplary frequency bands in the two embodiments according to FIGS. 2A and 2B. As already described several times, it is evident from FIG. 4, that the data-acquisition and evaluation of each frequency band takes place in a cyclical manner without interruption. With an identical number of spectral lines in each of the four frequency bands, a frequency resolution and measuring time, which is indirectly proportional to the starting frequency of the respective frequency band, is obtained for each frequency band. Accordingly, by comparison with the lower-frequency frequency band IV, a significantly shorter measuring time is obtained for the high-frequency frequency band I (measuring time in frequency band I: 1*T; measuring time in frequency band IV: 30*T). The data-evaluations can take place in a quasi-parallel manner in the relevant calculation units in the background, without influencing the data acceptance and decimation of the data in the corresponding processing stages. In particular, averaging operations can be implemented in the background and in a quasi-parallel manner for higher-frequency bands, while the data acceptance and processing for lower-frequency bands has not yet been concluded. Only in the lower-frequency bands II, III, and IV are delay times $T_{Delayi}$ of different magnitude obtained in the respective frequency band i at the beginning of the data-acquisition and data-evaluation as a result of delay times in the series-connected decimation units.

With parallelization of data-acquisition and evaluation in the individual frequency bands, the total measuring time $T_{MGes}$ is obtained approximately according to equation (1c).

$$T_{MGes} \approx T_{M\,MAX} = \max\{T_{Mi}\} \text{ where}$$

$$T_{Mi} = \sum_{i=1}^{M} (T_{Mesi\_j}) + T_{Delayi} + T_{FFTi} + T_{Miti}T_{Dispi} \tag{1c}$$

$$= m \cdot T_{Mesi} + T_{Delayi} + T_{FFTi} + T_{Miti} + T_{Dispi}$$

The total measuring time $T_{MGes}$ of the method according to the invention and the device according to the invention as shown in equation (1c) is obtained substantially from the frequency band with the longest individual measuring time. Once again, this is determined predominantly from the product of the data-acquisition time for an individual measurement evaluation and the number of averagings for this frequency band. The further additive terms result from the fact that the corresponding operations can no longer be implemented in parallel with the data acceptance, but only sequentially after the completion of the preceding operations. For example, with m averagings, (m−1) FFTs can be implemented in parallel with the data acceptance; but the last FFT can only be implemented when the corresponding data acceptance for the last FFT has already been concluded. Accordingly, a significant reduction is obtained by comparison with the total measuring time $T_{MGes}$ of the method and the device of the prior art with a total measuring time of $T_{MGes}$, which is obtained according to equation (1a) or (1b) from the sum of the individual measuring times $T_{Mi}$.

Figure 5:
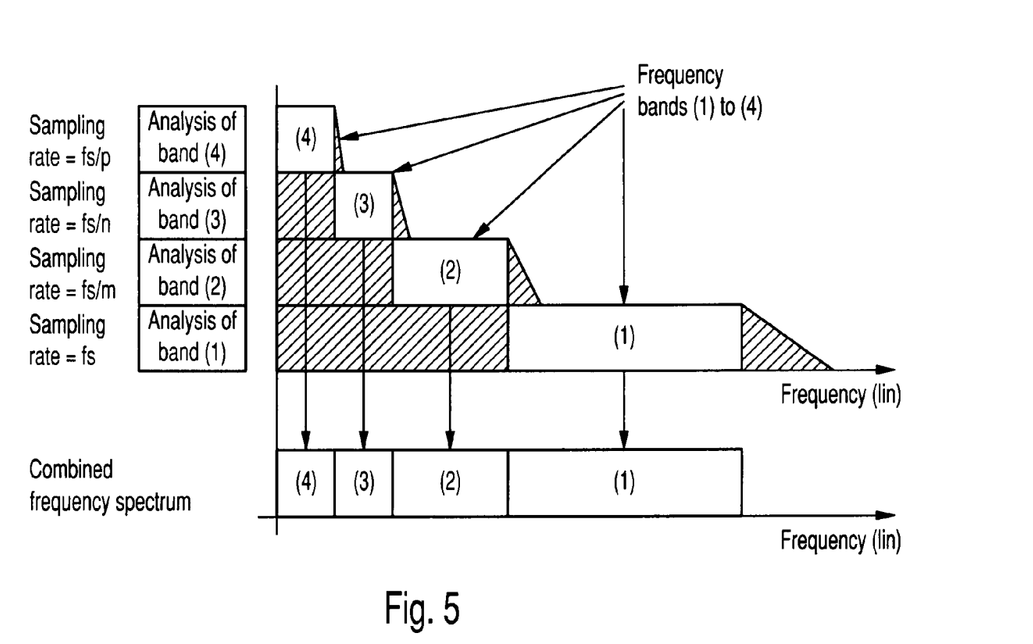
FIG. 5 shows a frequency spectrum of the method according to the invention and the device according to the invention for spectral analysis of a signal with four overlapping FFT frequency bands.

FIG. 5 presents the frequency spectrum combined from four overlapping frequency bands (1) to (4). Because of the overlapping—shaded areas in FIG. 5—the spectral values already acquired for the respectively higher-frequency frequency bands can be used in the data-evaluation for lower-frequency frequency bands. Accordingly, the use of successive filtering, decimation and Fourier analysis in the method according to the invention and the device according to the invention for spectral analysis of a signal reduces the measuring time required.

The invention is not restricted to the exemplary embodiment presented. In particular, a method and a device, in which, by contrast with the above description, the measurement is implemented in the direction from the lower frequencies to higher frequencies, are also covered by the invention. The invention also covers an offline data-evaluation of the acquired, digitally-converted and stored data instead of an online data-evaluation.

The invention claimed is:

1. A method for spectral analysis of a signal in several adjacent frequency bands with different corresponding frequency resolutions in each case, which comprises at least one data-acquisition step and a subsequent data-evaluation step for each frequency band,
wherein the data-acquisition step and the subsequent data-evaluation step proceed cyclically without interruption for each frequency band of the spectral analysis,
the data-acquisition step includes a step of sampling the signal at a sampling frequency according to the Nyquist criterion to be at least double the value of the upper frequency of the respective frequency band; and a step of storing the respectively-sampled values of the signal in a ring memory associated with the respective frequency band,
the data-evaluation step includes a digital spectral-estimation method, and
the sampling step includes for each frequency band at least one subordinate sampling step and the second and each subsequent subordinate sampling step includes a low-pass filtering step having different bandwidth and a subsequent undersampling, wherein the low-pass filtering step filters out the respective frequency band of the previous sampling step and the frequency bands are adjacent to one another,
wherein spectral values already calculated in a Fourier analysis of a higher-frequency overlapping frequency band are used as temporary spectral values for lower-frequency frequency bands, until all spectral values in the lower-frequency frequency bands have been calculated by means of Fourier analysis.

2. The method for spectral analysis according to claim 1, wherein the signal is at least one of a useful signal, a noise signal, a useful signal with at least one of a superposed noise signal and a superposed interference signal, and a noise signal with at least one of a superposed useful signal and a superposed interference signal.

3. The method for spectral analysis according to claim 1, wherein the digital spectral-estimation method is a Fourier analysis.

4. The method for spectral analysis according to claim 1, wherein a first subordinate sampling is an analog/digital conversion.

5. The method for spectral analysis according to claim 1, comprising, for at least one frequency band, implementing at least one averaging step of the spectral values calculated in the individual data-evaluation steps following or during several cyclically-performed data-acquisition steps and data-evaluation steps.

6. The method for spectral analysis according to claim 5, comprising averaging spectral values at the edge of each frequency band as a function of spectral values at the edge of the respective frequency band and/or spectral values at the edge of the respectively-adjacent frequency band or spectral values in the overlap region of a further frequency band overlapping with the respective frequency band.

7. The method for spectral analysis according to claim 5, comprising implementing a display of the spectral values after the Fourier analysis and averaging of the spectral values of each frequency band.

8. A device for spectral analysis of a signal in several adjacent frequency bands each with a different corresponding frequency resolution comprising:
several sampling units which generate sampling sequences associated with the respective frequency band with a sampling frequency according to the Nyquist criterion to be at least double the value of the upper frequency of the respective frequency band;
associated ring memories, wherein the ring memories are arranged to store a sampling sequence of the signal for each respective frequency band in a cyclical manner without interruption; and
associated discrete Fourier transformers each of which calculates spectral values associated with the respective frequency band in a cyclical manner, wherein a second and each further sampling units is/are a decimation unit comprising in each case a low-pass filter having a different bandwidth arranged to filter out the respective frequency band of the previous sampling unit and a subsequent undersampling unit,
whereby the frequency bands are adjacent to one another and whereby spectral values already calculated in a discrete Fourier transform for a higher-frequency overlapping frequency band are used as temporary spectral values for lower-frequency frequency bands, until all spectral values have been calculated by means of discrete Fourier transforms for the lower-frequency bands.

9. The device for spectral analysis according to claim 8, wherein the sampling units are connected to one another in series or in parallel.

10. The device for spectral analysis according to claim 8, wherein a first sampling unit is an analog/digital converter.

11. The device for spectral analysis according to claim 8, comprising a functional unit for a calculation of power and power-density connected to a display device and connected in series to each discrete Fourier transformer.

* * * * *

UNITED STATES PATENT AND TRADEMARK OFFICE
CERTIFICATE OF CORRECTION

PATENT NO. : 8,768,638 B2  
APPLICATION NO. : 11/663939  
DATED : July 1, 2014  
INVENTOR(S) : Gregor Feldhaus et al.

It is certified that error appears in the above-identified patent and that said Letters Patent is hereby corrected as shown below:

In the Claims:

At Column 10, line 40, "lower-frequency bands." should be -- lower-frequency frequency bands. --.

Signed and Sealed this  
Fourteenth Day of July, 2015

Michelle K. Lee  
*Director of the United States Patent and Trademark Office*